United States Patent
Kuibira et al.

(12) 
(10) Patent No.: US 6,365,879 B1
(45) Date of Patent: Apr. 2, 2002

(54) WAFER HOLDER FOR SEMICONDUCTOR MANUFACTURING APPARATUS

(75) Inventors: Akira Kuibira; Hirohiko Nakata, both of Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 09/707,810

(22) Filed: Nov. 7, 2000

(30) Foreign Application Priority Data

Jan. 20, 2000 (JP) ....................................... 2000-012225

(51) Int. Cl.[7] .............................. H05B 3/68; H05B 3/48
(52) U.S. Cl. ..................................... 219/444.1; 219/544
(58) Field of Search .......................... 219/443.1, 444.1, 219/465.1, 466.1, 467.1, 468.1, 468.2, 543, 544, 546; 118/724, 725

(56) References Cited

U.S. PATENT DOCUMENTS

| | | | | |
|---|---|---|---|---|
| 2,007,111 A | * | 7/1935 | Morgan | 219/544 |
| 2,799,765 A | * | 7/1957 | Jenkins et al. | 219/468.2 |
| 5,119,761 A | * | 6/1992 | Nakata | 118/725 |
| 5,151,871 A | * | 9/1992 | Matsumura et al. | 219/444.1 |
| 5,851,298 A | * | 12/1998 | Ishii | 118/728 |
| 5,904,872 A | * | 5/1999 | Arami et al. | 216/444.1 |

FOREIGN PATENT DOCUMENTS

| | | |
|---|---|---|
| JP | 2604944 | 1/1997 |
| JP | 2987085 | 10/1999 |

* cited by examiner

*Primary Examiner*—Sang Paik
(74) *Attorney, Agent, or Firm*—W. F. Fasse; W. G. Fasse

(57) ABSTRACT

A wafer holder includes a heater interposed between at least one pair of ceramic base members. The wafer holder can be regarded as including a holding surface side structure on a side of the heater facing toward the wafer, and a backside structure on the opposite side of the heater. The backside structure has a heat insulating character. The ceramic base member in the backside structure is formed of ceramic having a lower heat conductivity than that of the ceramic base member in the holding surface side structure. Further, the ceramic base member in the backside structure has a heat conductivity of 100 W/mK or less and a joint layer has a heat conductivity of 10 W/mK or less. In this way, the wafer holder prevents heat from spreading toward the backside of the wafer holder.

28 Claims, 6 Drawing Sheets

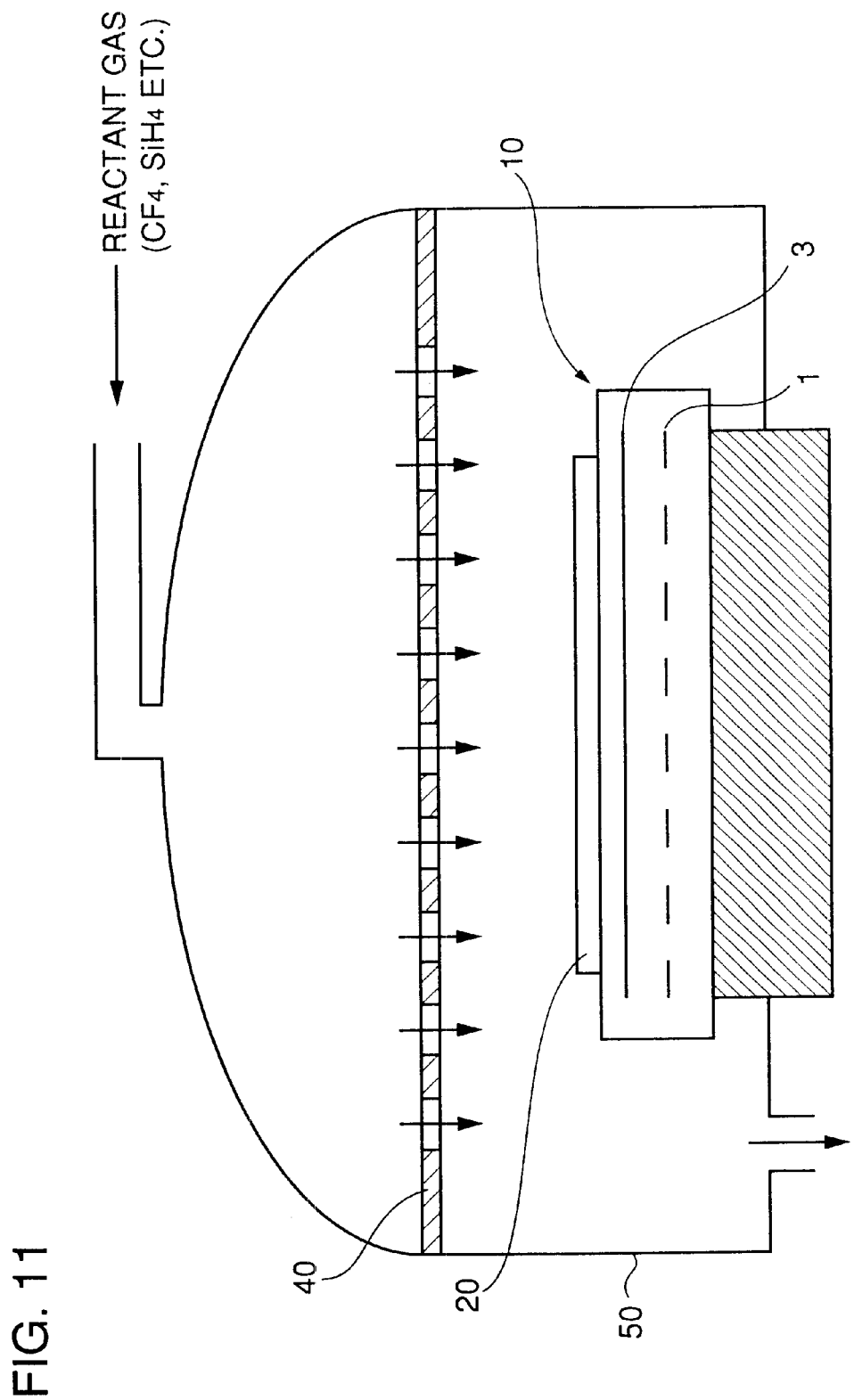

WAFER HOLDER FOR SEMICONDUCTOR MANUFACTURING APPARATUS

BACKGROUND OF THE INVENTION

1. Field of the Invention

The present invention relates to a wafer holder for a semiconductor manufacturing apparatus. In particular, the invention relates to a heater holder or an electrostatic chuck holder with heater which serves a function of holding a wafer while heating it.

2. Description of the Background Art

For etching of a semiconductor wafer surface or depositing of a film thereon, a method has been employed according to which gas for etching or for film deposition is supplied through the batch processing to a large number of wafers held on racks, and then the wafers are heated as required from the outer periphery (hot wall method).

However, as requirements become severer for higher integration and speed of semiconductor devices, a problem arises of non-uniform etching and unequal quality of completed films due to difference in temperature and gas flow depending on the location in the apparatus. Then, the single wafer processing (susceptor heating) has gradually been employed instead in which a plurality of etching apparatuses and film deposition apparatuses are arranged side by side and wafers are transported automatically by a loader through the apparatuses where the wafers are processed one by one. For the purpose of uniformly heating these wafers, a method is employed according to which the loader places a wafer on a holder in a chamber of the etching apparatus or the film deposition apparatus, the wafer is secured to the holder by an electrostatic chuck or statically fastened to the holder by enhancing surface precision of a wafer supporting surface of the holder, and then heat is directly applied from the holder to uniformly heat the wafer. It is thus necessary that at least a portion of the holder, which is in contact with the wafer, is formed of a material having corrosion resistance against a highly corrosive gas such as halogen gas and the like and having a high heat conductivity, and that the holder itself has an electrostatic chuck function and a mechanically fixing function as well as a heater function.

Aluminum nitride has been noticed as a candidate for the holder material because of its corrosion resistance and high heat conductivity. The high heat conductivity of the aluminum nitride allows heat generated from heater lines to spread immediately, achieving high-speed heating of the wafer as well as uniform heating of the inside of the aluminum nitride holder. Therefore, the aluminum nitride is suitable for uniformly heating a wafer.

However, regarding the holder as described above, heat generated from the heater is transmitted in not only the direction of the wafer holding surface but all directions immediately. Accordingly, the heat is also transmitted toward the backside of the holder opposite the wafer holding surface. As a result, energy is wastefully consumed leading to a great energy loss.

There is another problem that a considerable degradation occurs on the backside of the holder due to heating thereof, where there are provided line electrodes, line or the like extending from a terminal of a temperature measurement device provided for temperature control, and a seal between the holder and the chamber.

If the holder is produced by providing a wire or coil of Mo or the like between compact pieces of aluminum nitride and hot-pressing them, or by stacking a plurality of compact pieces of aluminum nitride having surfaces to which paste of refractory metal such as W and Mo is applied and simultaneously sintering them, the same aluminum nitride materials are located on and under a heater respectively so that the same amount of heat generated from the heater is transmitted not only to the material on the heater but to the material under the heater.

Then, the holder is formed into a structure having its backside reduced in size relative to the front side so as to restrict heat transmission to the backside. Nevertheless, as long as the backside is made of aluminum nitride having a high heat conductivity, the heat transmission cannot be avoided completely.

SUMMARY OF THE INVENTION

One object of the present invention is therefore to provide a wafer holder for a semiconductor manufacturing apparatus that can prevent heat from spreading toward the backside opposite a wafer holding surface of the wafer holder.

According to one aspect of the invention, a wafer holder for a semiconductor manufacturing apparatus includes a heater and a pair of ceramic base members with the heater interposing therebetween. The wafer holder has a wafer holding surface and a backside surface opposite each other with the heater therebetween. The wafer holder is characterized in that the ceramic on the backside relative to the heater has a lower heat conductivity than that of ceramic on the wafer holding surface side relative to heater.

According to the one aspect of the invention, in the wafer holder for a semiconductor manufacturing apparatus, the ceramic on the backside relative to the heater has a lower heat conductivity than that of the ceramic on the wafer holding surface side, so that it is possible to prevent heat from escaping toward the portion under the heater (backside) and thus efficiently heat a wafer located on the wafer holding surface. In this way, the wafer can be heated quickly, and further, degradation of seal provided under the holder can be avoided.

According to another aspect of the invention, a wafer holder for a semiconductor manufacturing apparatus includes a heater and a pair of ceramic base members with the heater interposing therebetween, and has a wafer holding surface and a backside surface opposite each other with the heater therebetween. The wafer holder is characterized in that a heat insulating layer is formed on the backside relative to the heater.

According to the another aspect of the invention, in the wafer holder for a semiconductor manufacturing apparatus, the heat insulating layer is formed on the backside relative to the heater, so that it is possible to prevent heat from escaping toward the portion under the heater (backside) and thus efficiently heat a wafer located on the wafer holding surface. In this way, the wafer can be heated quickly, and further, degradation of seal provided under the holder can be avoided.

According to a further aspect of the invention, a wafer holder for a semiconductor manufacturing apparatus includes a heater and a pair of ceramic base members with the heater interposing therebetween, and has a wafer holding surface and a backside surface opposite each other with the heater therebetween. The wafer holder is characterized in that a gap is provided between the backside surface and the heater of the wafer holder.

According to the further aspect of the invention, in the wafer holder for a semiconductor manufacturing apparatus, the gap provided under the heater serves as a heat insulating structure, so that it is possible to prevent heat from escaping toward the portion under the heater (backside) and thus efficiently heat a wafer located on the wafer holding surface. In this way, the wafer can be heated quickly, and further, degradation of seal provided under the holder can be avoided.

According to a still further aspect of the invention, a wafer holder for a semiconductor manufacturing apparatus includes a heater and a pair of ceramic base members with the heater interposing therebetween, and has a wafer holding surface and a backside surface opposite each other with the heater therebetween. The wafer holder is characterized in that ceramic on the backside relative to the heater has a lower heat conductivity than that of ceramic on the wafer holding surface side, a heat insulating layer is formed on the backside relative to the heater, and a gap is provided between the backside surface and the heater of the wafer holder.

According to the still further aspect of the invention, the wafer holder for a semiconductor manufacturing apparatus can provide a combination of heat insulating effects achieved respectively by the lower heat conductivity of the backside ceramic material than that of the ceramic material on the wafer holding surface side, the heat insulating layer formed on the backside relative to the heater, and the gap provided under the heater. As a result, the wafer can be heated more quickly and degradation of seal provided under the holder can further be prevented.

Preferably, in the wafer holder for a semiconductor manufacturing apparatus, the ceramic base member that is on the backside is formed of a material having a heat conductivity of at most 100 W/mK.

Accordingly, the ceramic material on the backside can have a heat insulating function.

Preferably, in the wafer holder for a semiconductor manufacturing apparatus, an intermediate layer is formed between the heater and the ceramic base member on the backside, and the intermediate layer is a joint layer having a heat conductivity of at most 10 W/mK.

Accordingly, the joint layer can have a heat insulating function.

Preferably, in the wafer holder for a semiconductor manufacturing apparatus, the joint layer has a thickness of at least 10 μm.

The heat insulating function of the joint layer can thus be enhanced.

Preferably, in the wafer holder for a semiconductor manufacturing apparatus, the ceramic base members are formed of a material including at least one selected from the group consisting of aluminum nitride, aluminum oxide, silicon nitride and silicon carbide.

A material having corrosion resistance as well as a high heat conductivity can thus be selected properly.

Preferably, in the wafer holder for a semiconductor manufacturing apparatus, the gap has a thickness of at least 0.01 mm.

The heat insulating function of the gap can thus be enhanced.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 11 is a schematic cross section of a semiconductor manufacturing apparatus without a plasma generating electrode, to which a wafer holder in the embodiment of the present invention is applied.

DESCRIPTION OF THE PREFERRED EMBODIMENTS

Embodiments of the present invention are hereinafter described in conjunction with the drawings.

Figure 1:
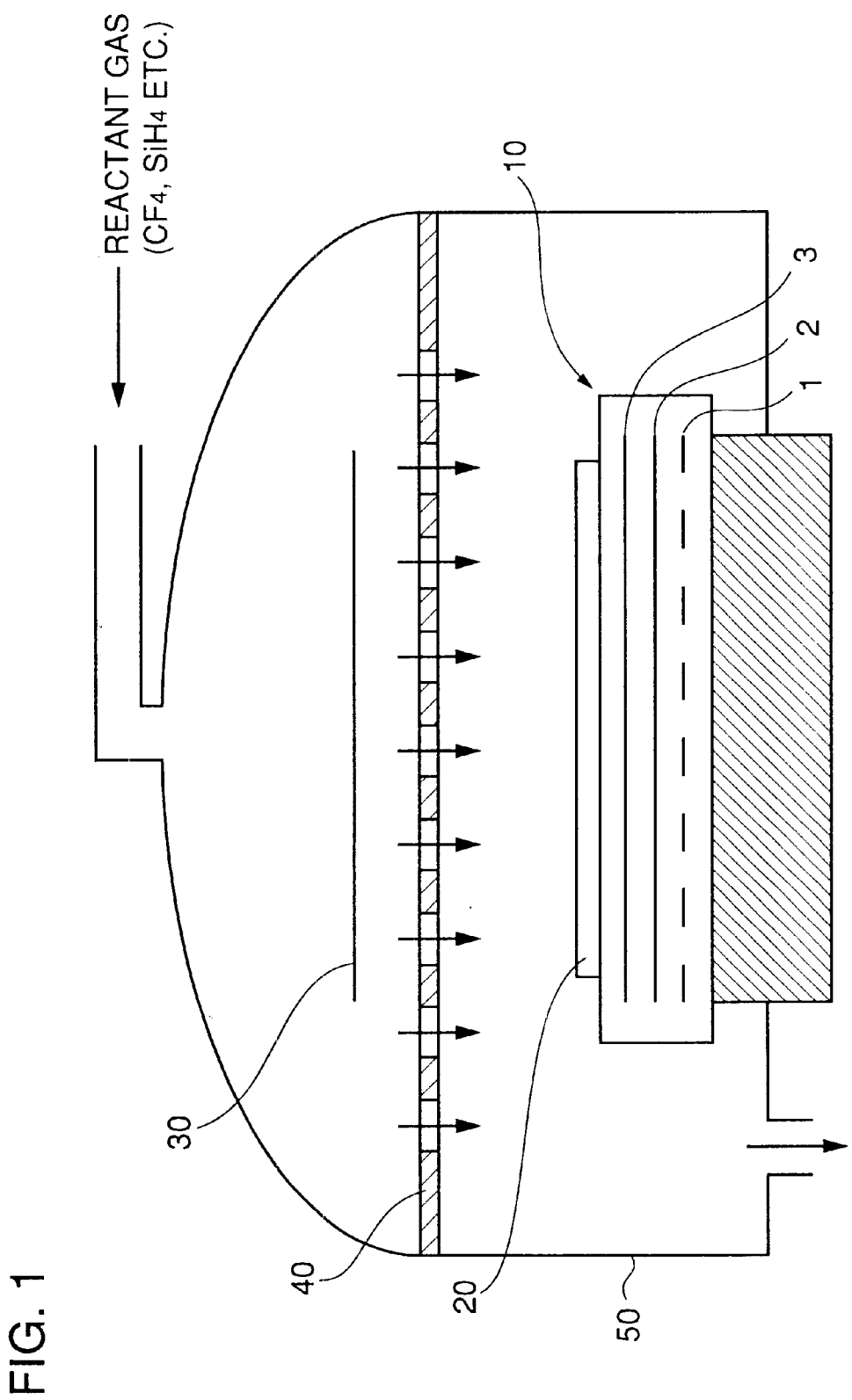
FIG. 1 is a schematic cross section of a structure of a semiconductor manufacturing apparatus having a wafer holder according to one embodiment of the present invention.

Referring to FIG. 1, a semiconductor manufacturing apparatus is structured to mainly include in a vacuum container 50 a wafer holder 10, an upper electrode 30 for generating plasma, and a gas shower unit 40.

Wafer holder 10 holds a wafer 20 on its surface and includes a heater 1 for heating wafer 20, a lower electrode 2 for generating plasma, and an electrostatic chuck electrode 3 for electrostatically securing wafer 20.

Figure 2:
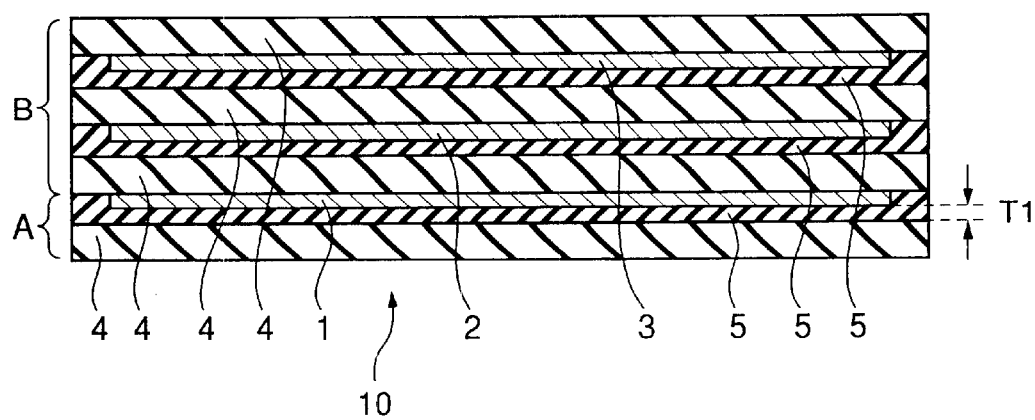
FIG. 2 is a schematic cross section of a structure of a wafer holder according to the one embodiment of the present invention.

Referring to FIG. 2, wafer holder 10 in this embodiment has a structure in which heater 1, plasma generating lower electrode 2 and electrostatic chuck electrode 3 are each placed between ceramic base members 4 to be stacked on each other. Ceramic base members 4 are bonded to each other by a joint layer 5 made of an oxide such as glass, for example.

In this embodiment, a structure on the backside of heater 1, herein referred to as a backside structure A, has a heat insulating effect as shown in FIG. 2.

One method of providing the heat insulating effect to the backside structure A is to provide, as a heat insulating structure, the backside structure A having a lower heat conductivity than that of a structure on the wafer holding surface side, herein referred to as a wafer holding side structure B. This structure can be obtained by using a material having a heat conductivity of at least 150 W/mK (e.g. aluminum nitride), for example, as ceramic base member 4 of the wafer holding side structure B and using ceramic having a lower heat conductivity of at most 100 W/mK as ceramic base member 4 of the backside structure A. In particular, the heat conductivity of 100 W/mK or less of ceramic base member 4 in the backside structure A is preferable since the heat insulating effect is enhanced. Preferably, a material for ceramic base member 4 used in the backside structure A is at least one selected from the group consisting of aluminum nitride, aluminum oxide, silicon nitride and silicon carbide because of the corrosion resistance of these materials. However, the aluminum nitride is especially preferred.

Although the side surface of the backside structure A has a small area, the side surface could be exposed to corrosive gas. Therefore, preferably the side surface is also formed of aluminum nitride having a heat conductivity of 100 W/mK or less.

It is noted that the aluminum nitride generally has a heat conductivity of approximately 170 W/mK. The simplest method for adjusting this heat conductivity of the aluminum nitride to 100 W/mK or less is to add for example oxygen, Si, transition metal and the like to the aluminum nitride and sinter the resultant aluminum nitride. However, this method is not the only method for obtaining a lower heat conductivity.

Preferably, joint layer 5 in the backside structure A has a heat conductivity of 10 W/mK or less since an enhanced heat insulating effect can be achieved. Joint layer 5 preferably has a thickness T1 of at least 10 μm. Further, it is possible to restrain heat from being transmitted by providing at least two joint layers 5 each having a thickness of at least 10 μm.

Figure 3:
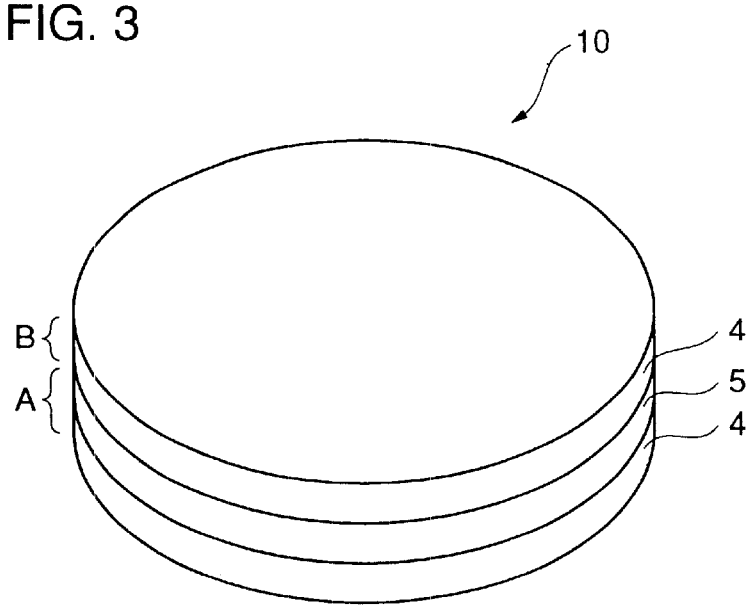
FIG. 3 is a perspective view illustrating that the outer shape of the structure under a heater is substantially the same as that of the structure over the heater.

The backside structure A may constitute a heat insulating structure (heat insulating layer) having an outer shape which is substantially the same as that of the wafer holding side structure B as shown in FIG. 3. In this case, respective peripheral surfaces of the backside structure A and the wafer holding side structure B form a continuing surface.

Figure 4:
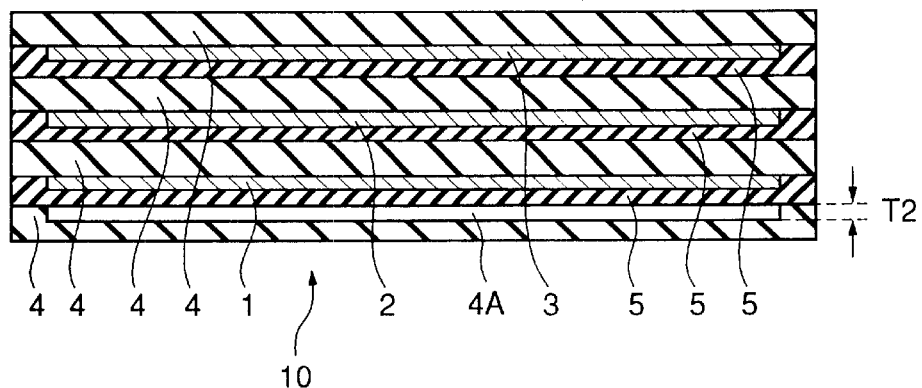
FIG. 4 is a schematic cross section of a structure of a wafer holder having a gap.

The heat insulating structure can also be implemented by providing a gap 4A as shown in FIG. 4 between heater 1 and the backside of wafer holder 10, which remarkably increases the heat insulating effect of the backside structure A. The maximum heat insulating effect would be gained if gap 4A is a vacuum gap, however, a sufficient heat insulating effect could be gained even if gas is present in gap 4A. A required amount of heat to be generated in the wafer holder having gap 4A decreases by approximately 50% as compared with that in a wafer holder without such a gap if respective wafer heating surfaces are set at the same temperature. The wafer holder with gap 4A is accordingly highly effective in heat insulation for the backside. If gap 4A has a thickness of 0.01 mm or more, the heat insulating effect is remarkably high. At least two gap layers 4A may be provided such that the total thickness of gap layers 4A along an arbitrary cross section is 0.01 mm or more.

The backside structure A may be constituted of a porous material with a void (gap) having a total valid thickness of 0.01 mm along an arbitrary cross section.

Gap 4A is produced by providing a depression in one or the other of ceramic base members and joining them. However, gap 4A could deteriorate the mechanical strength of holder 10. Accordingly, a plurality of supporters 4B are provided to gap 4A as shown in FIGS. 5 and 6 to generate a composite structure for the purpose of enhancing the heat insulating effect while maintaining a necessary mechanical strength.

Figure 5:
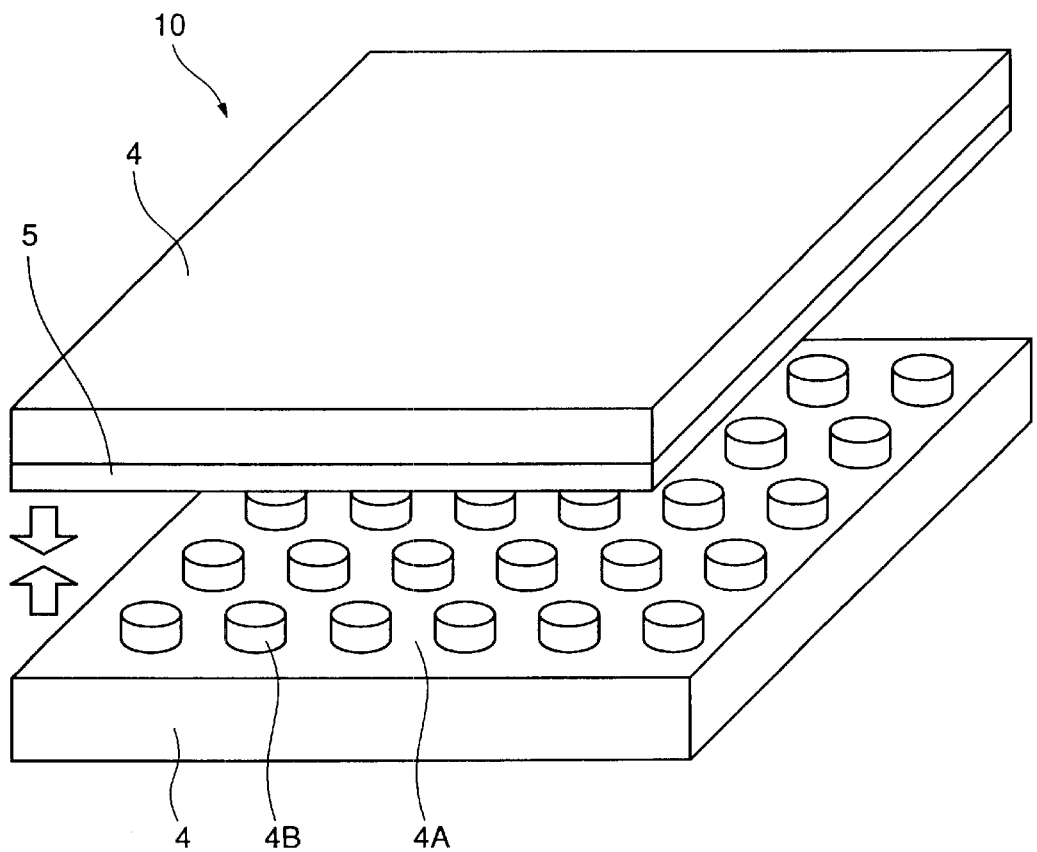
FIG. 5 is a perspective view of a structure of a wafer holder having supporters provided to a gap.
Figure 6:
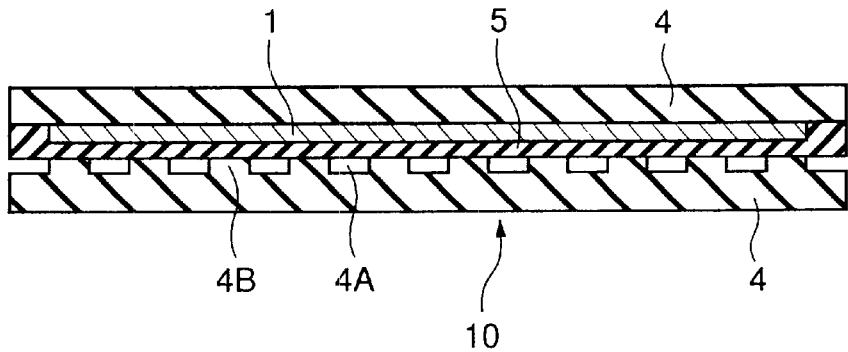
FIG. 6 is a schematic cross section of the structure of the wafer holder having the supporters provided to the gap.

It is noted that FIG. 6 is a cross section of the structure shown in FIG. 5. In FIG. 6, the upper part is overlaid on the lower part. Plasma generating lower electrode 2 and electrostatic chuck electrode 3 are not shown in FIGS. 3, 5 and 6 for convenience of description.

Figure 7:
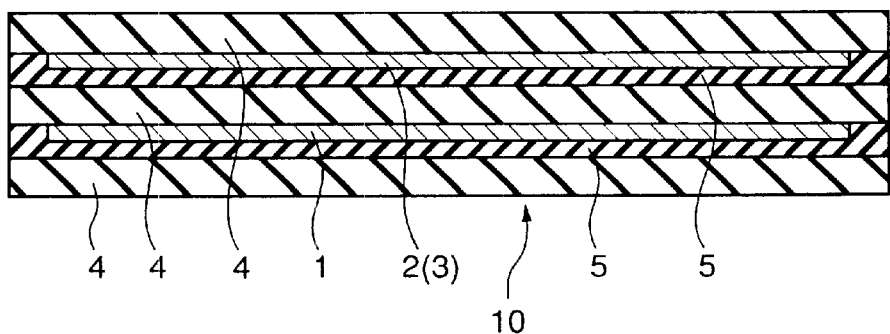
FIG. 7 is a schematic cross section of a structure of a wafer holder having a conductive layer formed of two layers, i.e. a heater and another conductive layer.
Figure 8:
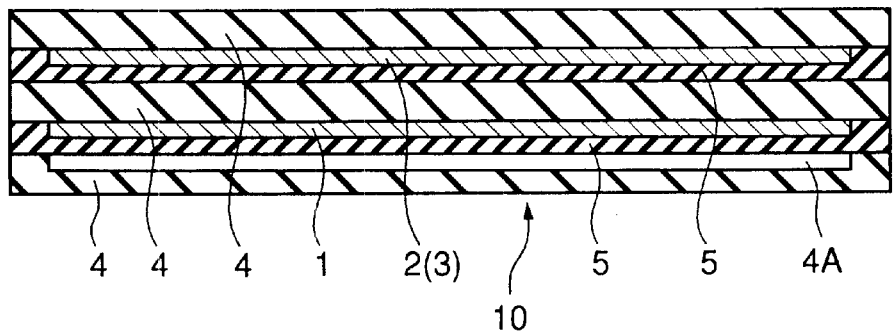
FIG. 8 is a schematic cross section of a structure of a wafer holder having a conductive layer formed of two layers, i.e. a heater and another conductive layer and further having a gap.

The heat insulating structure as discussed above is applicable to a two-layer structure constituted of a heater layer 1 and a plasma generating lower electrode 2 or electrostatic chuck electrode 3 as shown in FIGS. 7 and 8. In the case of the two-layer structure, a conductive layer above heater 1 may serve as both of the plasma generating lower electrode and electrostatic chuck electrode.

Figure 9:
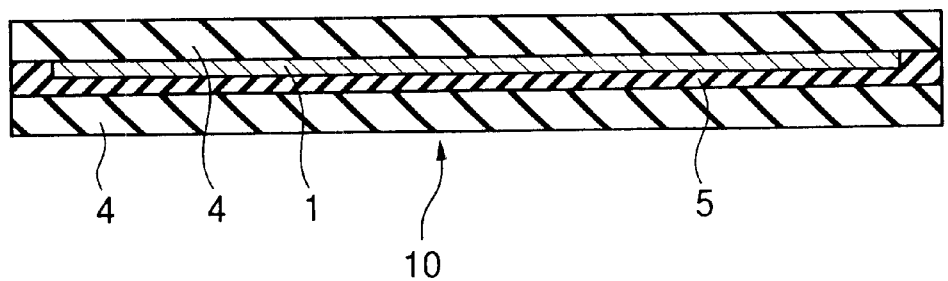
FIG. 9 is a schematic cross section of a structure of a wafer holder having a conductive layer formed of a single heater layer.
Figure 10:
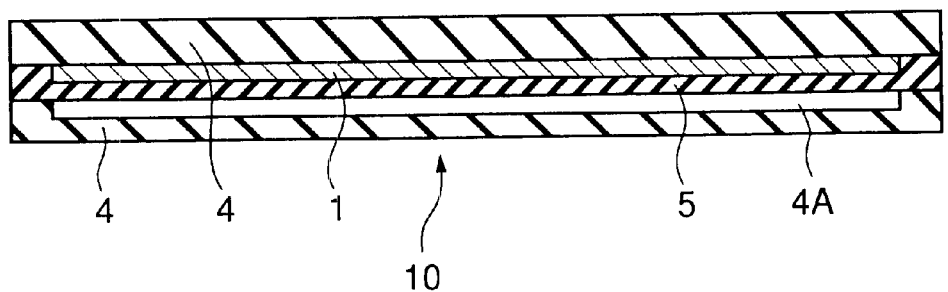
FIG. 10 is a schematic cross section of a structure of a wafer holder having a conductive layer formed of a single heater layer and further having a gap.

Further, the above heat insulating structure is applicable to a one-layer structure including a heater layer 1 only as shown in FIGS. 9 and 10.

Still further, the above heat insulating structure is applicable to a wafer holder 10 employed in a semiconductor manufacturing apparatus without using a plasma generating electrode as shown in FIG. 11. In this case, no plasma generating lower electrode is formed in wafer holder 10.

It is noted that the heat conductivity of ceramic base member 4 in the wafer holding side structure B is preferably at least 150 W/m for the purpose of speedily heating a wafer. As a material for the ceramic base member 4 in the wafer holding side structure B is preferably at least one selected from the group consisting of aluminum nitride, aluminum oxide, silicon nitride and silicon carbide. However, the aluminum nitride is especially preferred.

A superior heat insulating effect would be achieved by combining the structure in which ceramic base member 4 in the backside structure A has a lower heat conductivity than that of ceramic base member 4 in the wafer holding side structure B, the structure in which a heat insulating layer is formed in the backside structure A, and a structure in which a gap is provided between heater 1 and the backside of wafer holder 10, or combining arbitrary two of those structures so as to combine respective heat insulating effects.

Description is now given below of a method of manufacturing a wafer holder in this embodiment.

Sintered aluminum nitride piece can be produced by a conventional method. According to this method, generally a sintering agent is first mixed with aluminum nitride powder. In consideration of corrosion resistance in actual use, a smaller amount of this agent is preferred. At this time, an organic binder is added for compacting as required. Any conventional method such as powder pressing and sheet forming is employed for compacting. Then, a heater circuit is formed. There are two methods for producing a heater circuit and post metalizing is one of the two.

According to the post metalizing, the compact piece is degreased and then sintered at a predetermined temperature. Any of known methods such as hot press, atmospheric sintering and HIP (hot isostatic pressing) may be employed for sintering. On this substrate, refractory metal such as W and Mo or a known wiring material such as Ag, Ag—Pd, Ag—Pt and Ni—Cr is formed into a required pattern. This pattern is generated, for example, by applying paste containing the above metal powder, agent for firing and binder are added so as to print a high precision pattern. The resultant piece is dried, degreased, and thereafter fired.

Another method for producing a heater circuit is co-fire. According to the co-fire, paste containing refractory metal such as W and Mo mentioned above is applied onto the compact piece as mentioned above which has not been sintered, the compact piece is degreased, and thereafter the applied metal layer and aluminum nitride are simultaneously sintered.

Metalized substrates produced by any of the above methods or a metalized substrate and a non-metalized substrate are joined to generate a structure in which heater 1 is embedded. When metalized substrates are joined, respective metalized surfaces are never joined face to face.

The substrates are joined with oxide layer joint layer) 5 interposing therebetween such that heater circuit 1 is located between oxide layer 5 and the surface on which a wafer is held. If the substrates are joined such that oxide layer 5 is present between heater circuit 1 and the wafer holding surface, the efficiency deteriorates in heat transfer from the heater layer and a great amount of heat escapes to the backside when a semiconductor wafer on the holder is heated. Oxide layer 5 may be formed by being applied to a metalized or non-metalized surface and baked, or applied by thermal spraying. Alternatively, vapor deposition, CVD, PVD and the like may be employed for producing oxide layer 5, however, these methods are inferior in efficiency of forming a thick film. Oxide powder may be applied by printing or thermal spraying. Organic salt, inorganic salt, nitride, fluoride, or carbide may be used if the material is converted to oxide by heating thereof. Glass powder may be used as the oxide powder. The material for oxide layer 5 is not particularly limited to those mentioned above if oxide layer 5 formed of the material has a heat conductivity of 10 W/mK or less and can join substrates.

EXAMPLE 1

To aluminum nitride powder, 5% by mass of $Y_2O_3$ as a sintering agent as well as polyvinyl alcohol as a binder were added, ethanol was used as a solvent, and they were dispersively mixed in a ball mill. The mixture was spray-dried and press-formed into two sheets such that each would have a dimension of $\phi$305 mm×1 mm after sintered. The sheets were degreased in nitrogen at 800° C. and sintered at 1800° C. for 4 hours. The sintered sheet piece had a heat conductivity of 175 W/mK. The resultant sintered sheet piece had its top and bottom surfaces polished by diamond abrasive. The periphery of the sintered sheet piece was polished until the dimension decreases to $\phi$300 mm.

Refractory metal paste obtained by kneading W powder and a sintering agent with an ethyl cellulose binder was applied onto one of the sheets of sintered pieces to form over the entire surface a pattern of a spiral heater line having a width of 1 mm and a line interval of 1 mm. Then, the metal paste was degreased in nitrogen at 800° C. and baked in nitrogen at 1600° C. to generate a heater line. On the other sheet of sintered piece having a dimension of $\phi$300 mm×1 mm, grass powder having a heat conductivity of 0.5 W/mK kneaded with an ethyl cellulose binder was printed to a thickness of 50 μm. Then, the glass powder was degreased at 500° C. on which the sintered piece having the heater line thereon was overlaid. They were fixed by a jig made of Mo, an weight of 500 g was placed thereon and accordingly joined in nitrogen at 800° C.

The temperature of the surface of thus produced wafer holder was adjusted to become 700° C. when current is applied with 200 V voltage. The amount of heat generated by the heater at this time was 2.0 W/mm².

COMPARATIVE EXAMPLE 1

A compact piece was prepared in the same manner as that in Example 1. Refractory metal paste containing W powder and a sintering agent kneaded with an ethyl cellulose binder was applied onto the compact piece. A print pattern to be produced by applying this paste was designed to have the same pattern as that in Example 1 after decreasing in size through sintering. Then, the compact piece with the applied paste was degreased in nitrogen at 800° C. and on which a compact piece having no such a paste applied thereon was overlaid. The stacked pieces were bonded by pressurizing them and thereafter sintered at 1800° C. for 4 hours.

The temperature of the surface of thus produced wafer holder was adjusted to become 700° C. when current is applied with 200 V voltage. The amount of heat generated by the heater at this time was 2.6 W/mm².

COMPARATIVE EXAMPLE 2

A compact piece was prepared in the same manner as that in Example 1. On this compact piece, a heating element formed of a 0.5 mm Mo wire shaped into a spiral was placed thereon. Further, a molded piece of the same shape was placed thereon. They were then degreased in nitrogen at 800° C. and placed in a mold formed of carbon to be hot-pressed at 1800° C. for 4 hours. The resultant sintered piece had its top and bottom surfaces polished by diamond abrasive until the periphery decreases to $\phi$300 mm. The sintered aluminum nitride piece had a heat conductivity of 170 W/mK and a thickness of 2 mm.

The temperature of the surface of thus produced wafer holder was adjusted to become 700° C. when current is applied with 200 V voltage. The amount of heat generated by the heater at this time was 2.8 W/mm².

EXAMPLE 2

A compact piece was prepared in the same manner as that in Example 1 to have a heat conductivity of 175 W/mK. On this compact piece, refractory metal paste including W powder and a sintering agent kneaded with an ethyl cellulose binder was applied to form the same pattern as that of Example 1. This was degreased in nitrogen at 800° C. and baked in nitrogen at 1600° C. to produce a heater line. On another sintered aluminum nitride piece which was not metalized and had a dimension of $\phi$300×1 mm and a heat conductivity of 40 W/mK, $SiO_2$-based glass powder kneaded with an ethyl cellulose binder was printed. This was degreased at 500° C. and the sintered piece having the heater line formed thereon was overlaid on the non-metalized piece. These pieces were fixed by a jig formed of Mo, a weight of 500 g was placed thereon and the pieces were joined in nitrogen at 700° C.

The temperature of the surface of thus produced wafer holder was adjusted to become 700° C. when current is applied with 200 V voltage. The amount of heat generated by the heater at this time was 2.2 W/mm².

EXAMPLE 3

A sintered piece was prepared in the same manner as that in Example 1 such that the outer diameter would be $\phi$320 mm after sintering and the heat conductivity was 175 W/mK. Refractory metal paste containing W powder and a sintering agent kneaded with an ethyl cellulose binder was applied on the sintered piece to form the same pattern as that of Example 1. This was degreased in nitrogen at 800° C. and baked in nitrogen at 1600° C. to produce a heater line. Further, a non-metalized substrate having a heat conductivity of 40 W/mK and a dimension of $\phi$320×1 mm was prepared, and a depression of $\phi$300 mm and 0.1 mm in depth was provided in the central area. On the non-metalized substrate, $SiO_2$ based glass powder kneaded with an ethyl cellulose binder was printed. This was degreased at 500° C. and the sintered piece having the heater line formed thereon was overlaid on the non-metalized substrate. The sintered piece and the substrate were joined at the periphery of 10 mm in width. The joint was produced by fixing the sintered piece and the substrate by a jig formed of Mo, placing a weight of 500 g thereon, and heating them in nitrogen at 700° C.

The temperature of the surface of thus produced wafer holder was adjusted to become 700° C. when current is applied with 200 V voltage. The amount of heat generated by the heater at this time was 1.5 W/mm$^2$.

The present invention as heretofore described employs the structure in which ceramic on the backside relative to the heater has a lower heat conductivity than that of ceramic on the wafer holding side, the structure in which the heat insulating layer is formed on the backside relative to the heater, and the structure in which the gap is provided between the heater and the backside of the wafer holder. One of these structures or a combination of any structures can prevent heat from escaping to the backside of the heater thereby efficiently heating a wafer placed on the wafer holder. Accordingly, not only a rapid heating of a wafer but prevention of degradation in a seal provided under the holder are possible.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A wafer holder for holding a wafer that is to be held in a semiconductor manufacturing apparatus, said wafer holder comprising:

a first ceramic base member;

a second ceramic base member, wherein said second ceramic base member has a lower heat conductivity than said first ceramic base member;

a heater interposed between said first and second ceramic base members, wherein said first ceramic base member is located on a front side relative to said heater adapted to face toward the wafer that is to be held, and said second ceramic base member is located on a back side relative to said heater opposite said front side and adapted to face away from the wafer that is to be held; and a joint layer that has a heat conductivity of at most 10 W/mK and that is provided between said heater and said second ceramic base member.

2. The wafer holder according to claim 1, wherein said second ceramic base member is formed of a material having a heat conductivity of at most 100 W/mK.

3. The wafer holder according to claim 1, wherein each one of said ceramic base members is respectively formed of at least one respective material individually respectively selected from the group consisting of aluminum nitride, aluminum oxide, silicon nitride and silicon carbide.

4. A wafer holder for holding a wafer that is to be held in a semiconductor manufacturing apparatus, said wafer holder comprising:

a first ceramic base member;

a second ceramic base member, wherein said second ceramic base member has a lower heat conductivity than said first ceramic base member;

a heater interposed between said first and second ceramic base members, wherein said first ceramic base member is located on a front side relative to said heater adapted to face toward the wafer that is to be held, and said second ceramic base member is located on a back side relative to said heater opposite said front side and adapted to face away from the wafer that is to be held; and an intermediate layer that has a thickness of at least 10 μm and that is provided between said heater and said second ceramic base member.

5. The wafer holder according to claim 4, wherein said second ceramic base member is formed of a material having a heat conductivity of at most 100 W/mK.

6. The wafer holder according to claim 4, wherein each one of said ceramic base members is respectively formed of at least one respective material individually respectively selected from the group consisting of aluminum nitride, aluminum oxide, silicon nitride and silicon carbide.

7. A wafer holder for holding a wafer that is to be held in a semiconductor manufacturing apparatus, said wafer holder comprising:

a first ceramic base member;

a second ceramic base member;

a heater interposed between said first and second ceramic base members, wherein said first ceramic base member is located on a front side relative to said heater adapted to face toward the wafer that is to be held, and said second ceramic base member is located on a back side relative to said heater opposite said front side and adapted to face away from the wafer that is to be held;

a heat insulating layer provided on said back side relative to said heater; and a joint layer that has a heat conductivity of at most 10 W/mK and that is provided between said heater and said second ceramic base member.

8. The wafer holder according to claim 7, wherein said second ceramic base member is formed of a material having a heat conductivity of at most 100 W/mK.

9. The wafer holder according to claim 7, wherein each one of said ceramic base members is respectively formed of at least one respective material individually respectively selected from the group consisting of aluminum nitride, aluminum oxide, silicon nitride and silicon carbide.

10. A wafer holder for holding a wafer that is to be held in a semiconductor manufacturing apparatus, said wafer holder comprising:

a first ceramic base member;

a second ceramic base member;

a heater interposed between said first and second ceramic base members, wherein said first ceramic base member is located on a front side relative to said heater adapted to face toward the wafer that is to be held, and said second ceramic base member is located on a back side relative to said heater opposite said front side and adapted to face away from the wafer that is to be held;

a heat insulating layer provided on said back side relative to said heater; and an intermediate layer that has a thickness of at least 10 μm and that is provided between said heater and said second ceramic base member.

11. The wafer holder according to claim 10, wherein said second ceramic base member is formed of a material having a heat conductivity of at most 100 W/mK.

12. The wafer holder according to claim 10, wherein each one of said ceramic base members is respectively formed of at least one respective material individually respectively selected from the group consisting of aluminum nitride, aluminum oxide, silicon nitride and silicon carbide.

13. A wafer holder for holding a wafer that is to be held in a semiconductor manufacturing apparatus, said wafer holder comprising:

a first ceramic base member;

a second ceramic base member;

a heater interposed between said first and second ceramic base members, wherein said first ceramic base member is located on a front side relative to said heater adapted to face toward the wafer that is to be held, and said second ceramic base member is located on a back side relative to said heater opposite said front side and adapted to face away from the wafer that is to be held;

a gap provided between said heater and a back surface of said wafer holder on said back side relative to said heater; and a joint layer that has a heat conductivity of at most 10 W/mK and that is provided between said heater and said second ceramic base member.

14. The wafer holder according to claim 13, wherein said second ceramic base member is formed of a material having a heat conductivity of at most 100 W/mK.

15. The wafer holder according to claim 13, wherein each one of said ceramic base members is respectively formed of at least one respective material individually respectively selected from the group consisting of aluminum nitride, aluminum oxide, silicon nitride and silicon carbide.

16. The wafer holder according to claim 13, wherein said gap has a thickness of at least 0.01 mm.

17. A wafer holder for holding a wafer that is to be held in a semiconductor manufacturing apparatus, said wafer holder comprising:

a first ceramic base member;

a second ceramic base member;

a heater interposed between said first and second ceramic base members, wherein said first ceramic base member is located on a front side relative to said heater adapted to face toward the wafer that is to be held, and said second ceramic base member is located on a back side relative to said heater opposite said front side and adapted to face away from the wafer that is to be held;

a gap provided between said heater and a back surface of said wafer holder on said back side relative to said heater; and an intermediate layer that has a thickness of at least 10 $\mu$m and that is provided between said heater and said second ceramic base member.

18. The wafer holder according to claim 17, wherein said second ceramic base member is formed of a material having a heat conductivity of at most 100 W/mK.

19. The wafer holder according to claim 17, wherein each one of said ceramic base members is respectively formed of at least one respective material individually respectively selected from the group consisting of aluminum nitride, aluminum oxide, silicon nitride and silicon carbide.

20. The wafer holder according to claim 17, wherein said gap has a thickness of at least 0.01 mm.

21. A wafer holder for holding a wafer that is to be held in a semiconductor manufacturing apparatus, said wafer holder comprising:

a first ceramic base member;

a second ceramic base member, wherein said second ceramic base member has a lower heat conductivity than said first ceramic base member;

a heater interposed between said first and second ceramic base members, wherein said first ceramic base member is located on a front side relative to said heater adapted to face toward the wafer that is to be held, and said second ceramic base member is located on a back side relative to said heater opposite said front side and adapted to face away from the wafer that is to be held;

a heat insulating layer provided on said back side relative to said heater;

a joint layer that has a heat conductivity of at most 10 W/mK and that is provided between said heater and said second ceramic base member; and a gap provided between said heater and a back surface of said wafer holder on said back side relative to said heater.

22. The wafer holder according to claim 21, wherein said second ceramic base member is formed of a material having a heat conductivity of at most 100 W/mK.

23. The wafer holder according to claim 21, wherein each one of said ceramic base members is respectively formed of at least one respective material individually respectively selected from the group consisting of aluminum nitride, aluminum oxide, silicon nitride and silicon carbide.

24. The wafer holder according to claim 21, wherein said gap has a thickness of at least 0.01 mm.

25. A wafer holder for holding a wafer that is to be held in a semiconductor manufacturing apparatus, said wafer holder comprising:

a first ceramic base member;

a second ceramic base member, wherein said second ceramic base member has a lower heat conductivity than said first ceramic base member;

a heater interposed between said first and second ceramic base members, wherein said first ceramic base member is located on a front side relative to said heater adapted to face toward the wafer that is to be held, and said second ceramic base member is located on a back side relative to said heater opposite said front side and adapted to face away from the wafer that is to be held;

a heat insulating layer provided on said back side relative to said heater;

an intermediate layer that has a thickness of at least 10 $\mu$m and that is provided between said heater and said second ceramic base member; and a gap provided between said heater and a back surface of said wafer holder on said back side relative to said heater.

26. The wafer holder according to claim 25, wherein said second ceramic base member is formed of a material having a heat conductivity of at most 100 W/mK.

27. The wafer holder according to claim 25, wherein each one of said ceramic base members is respectively formed of at least one respective material individually respectively selected from the group consisting of aluminum nitride, aluminum oxide, silicon nitride and silicon carbide.

28. The wafer holder according to claim 25, wherein said gap has a thickness of at least 0.01 mm.

* * * * *